(12) United States Patent
Siefering et al.

(10) Patent No.: US 12,334,348 B2
(45) Date of Patent: Jun. 17, 2025

(54) SUBSTRATE SCANNING APPARATUS WITH PENDULUM AND ROTATABLE SUBSTRATE HOLDER

(71) Applicant: TEL Manufacturing and Engineering of America, Inc., Chaska, MN (US)

(72) Inventors: Kevin Siefering, Excelsior, MN (US); Michael Gruenhagen, Norwood Young America, MN (US); Matthew Gwinn, Winchendon, MA (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 604 days.

(21) Appl. No.: 17/381,743

(22) Filed: Jul. 21, 2021

(65) Prior Publication Data
US 2023/0021625 A1    Jan. 26, 2023

(51) Int. Cl.
*H01L 21/26* (2006.01)

(52) U.S. Cl.
CPC .................. *H01L 21/26* (2013.01)

(58) Field of Classification Search
CPC ... H01L 21/26; H01L 21/68; H01L 21/68742; H01J 2237/20214; H01J 2237/20228; H01J 37/20
See application file for complete search history.

(56) References Cited

U.S. PATENT DOCUMENTS

| | | | | |
|---|---|---|---|---|
| 4,857,742 A | * | 8/1989 | Kato | H01J 37/3045 |
| | | | | 250/492.2 |
| 6,309,163 B1 | * | 10/2001 | Nering | G03F 7/7075 |
| | | | | 414/935 |
| 9,248,568 B2 | * | 2/2016 | Caveney | H01L 21/67766 |
| 10,843,236 B2 | | 11/2020 | Butterbaugh | |
| 2004/0191931 A1 | | 9/2004 | Murrell et al. | |
| 2008/0142726 A1 | | 6/2008 | Relleen et al. | |
| 2008/0142728 A1 | | 6/2008 | Smick et al. | |
| 2010/0029088 A1 | * | 2/2010 | Mayer | C25F 3/12 |
| | | | | 438/748 |
| 2018/0214915 A1 | * | 8/2018 | Butterbaugh | B08B 3/10 |

FOREIGN PATENT DOCUMENTS

JP    2006236746 A    9/2006

* cited by examiner

*Primary Examiner* — Dale E Page
*Assistant Examiner* — Quovaunda Jefferson
(74) *Attorney, Agent, or Firm* — Slater Matsil, LLP

(57) ABSTRACT

A method of scanning a substrate includes immobilizing a substrate on a substrate holder within a processing chamber and performing a pass of a parallel raster pattern by synchronously driving a first rotary drive and a second rotary drive to move the substrate relative to a processing apparatus focused on a localized spot on the substrate, the first rotary drive being coupled to a proximal end of a pendulum arm and the second rotary drive being mounted at a distal end of the pendulum arm and to the substrate holder. Driving the first rotary drive during the pass includes moving the pendulum arm in a first arc motion for a first portion of the pass while the localized spot is on the substrate, and then moving the pendulum arm in an opposite second arc motion for a second portion of the pass while the localized spot is on the substrate.

20 Claims, 10 Drawing Sheets

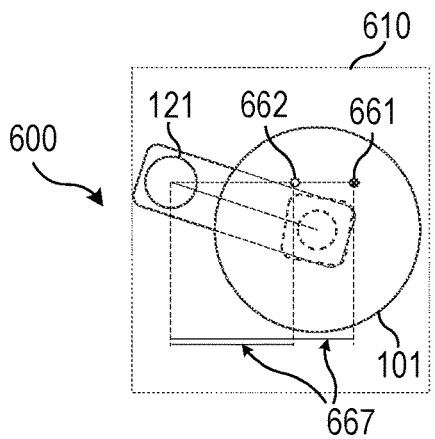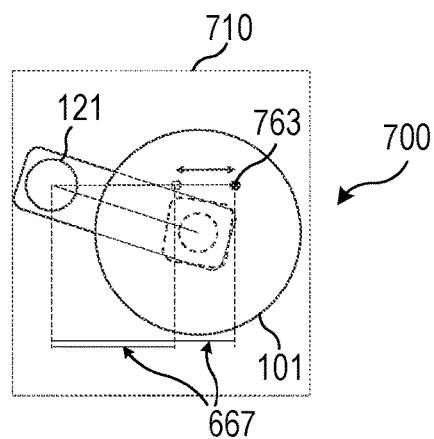
FIG. 6  FIG. 7
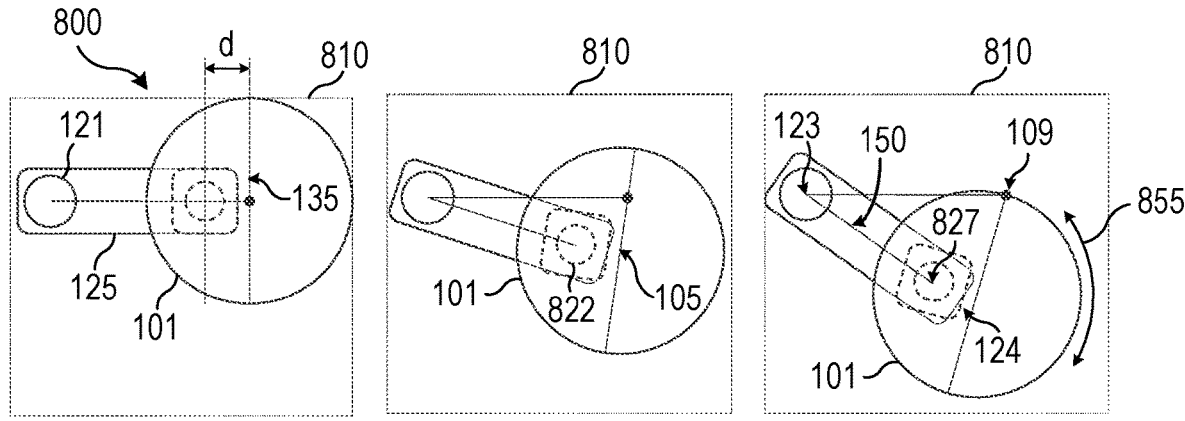
FIG. 8
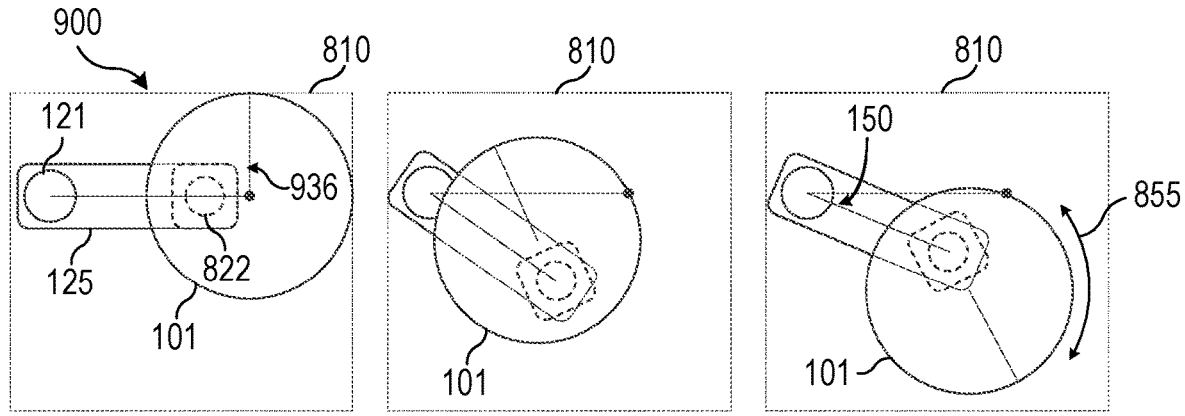
FIG. 9

SUBSTRATE SCANNING APPARATUS WITH PENDULUM AND ROTATABLE SUBSTRATE HOLDER

TECHNICAL FIELD

The present invention relates generally to substrate scanning, and, in particular embodiments, to apparatuses, systems, and methods of scanning a substrate including a rotatable substrate holder attached at the distal end of a pendulum arm.

BACKGROUND

Device formation within microelectronic workpieces generally involves a series of manufacturing techniques including formation, patterning, and removal of a number of layers of material on a substrate. Many substrate processing techniques are performed at a selected portion of the substrate rather than processing the entire substrate simultaneously. For example, a surface of the substrate may be exposed to a beam focused such that it is localized in a spot much smaller than the surface of the substrate. A substrate scanning apparatus moves the substrate or a processing apparatus in a raster pattern (i.e. a scanning pattern) over some or all of the substrate in order to process the substrate in a location-specific manner.

As feature sizes decrease and feature densities increase, substrate scanning apparatuses must provide ever increasing accuracy and flexibility in positioning the substrate during processing. A variety of two-dimensional scanning mechanisms are possible. However, conventional mechanisms are bulky and have a much larger footprint than the substrate size. Since these mechanisms are frequently located in the same vacuum environment as the substrate during processing, they require larger, more expensive vacuum chambers. Smaller conventional mechanisms cannot achieve the accuracy necessary for sensitive additive or subtractive location-specific processes.

SUMMARY

In accordance with an embodiment of the invention, a method of scanning a substrate includes immobilizing a substrate on a substrate holder within a processing chamber and performing a first pass of a parallel raster pattern by synchronously driving a first rotary drive and a second rotary drive to move the substrate relative to a processing apparatus focused on a localized spot on the substrate, the first rotary drive being coupled to a proximal end of a pendulum arm and the second rotary drive being mounted at a distal end of the pendulum arm and to the substrate holder. Driving the first rotary drive during the first pass includes moving the pendulum arm in a first arc motion for a first portion of the first pass while the localized spot is on the substrate, and then moving the pendulum arm in an opposite second arc motion for a second portion of the first pass while the localized spot is on the substrate.

In accordance with another embodiment of the invention, a system includes a vacuum chamber, a first rotary drive coupled to a proximal end of a pendulum arm disposed in the vacuum chamber a second rotary drive mounted at a distal end of the pendulum arm so that the second rotary drive moves with the distal end a substrate holder disposed in the vacuum chamber and coupled to the second rotary drive at a pivot point, and a controller coupled to the first rotary drive and the second rotary drive. The controller is configured to synchronously drive the first rotary drive and the second rotary drive to cause a parallel raster pattern to be traced on the substrate holder by a stationary location-specific processing apparatus.

In accordance with still another embodiment of the invention an apparatus includes a processing chamber, a pendulum arm disposed in the processing chamber, and a substrate holder. The pendulum arm includes a proximal end and a distal end. The proximal end is coupled to a first rotary drive. The first rotary drive is configured to move the pendulum arm in an arc motion centered at the proximal end. The substrate holder is disposed in the processing chamber and coupled to a second rotary drive at a pivot point that is offset from the center of the substrate holder in a first direction by an offset distance that is less than the outer radius of the substrate holder. The second rotary drive is mounted at the distal end of the pendulum arm and is configured to rotate the substrate holder about the pivot point synchronously with the arc motion of the pendulum arm to move the substrate holder laterally relative to a location-specific processing apparatus.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a schematic diagram of the top view of a substrate scanning apparatus that includes two or more static processing nozzles in accordance with an embodiment of the invention;

FIG. 7 illustrates a schematic diagram of the top view of a substrate scanning apparatus that includes a translational processing nozzle in accordance with an embodiment of the invention;

FIG. 8 illustrates three schematic diagrams of the top view of a substrate scanning apparatus that includes a rotary drive attached at a distal end of a pendulum arm and a substrate attached to the rotary drive at a pivot point offset from the center of the substrate in accordance with an embodiment of the invention;

FIG. 9 illustrates three more schematic diagrams of the top view of a substrate scanning apparatus that includes a rotary drive attached at a distal end of a pendulum arm and a substrate attached to the rotary drive at a pivot point offset from the center of the substrate in accordance with an embodiment of the invention;

Figure 1:
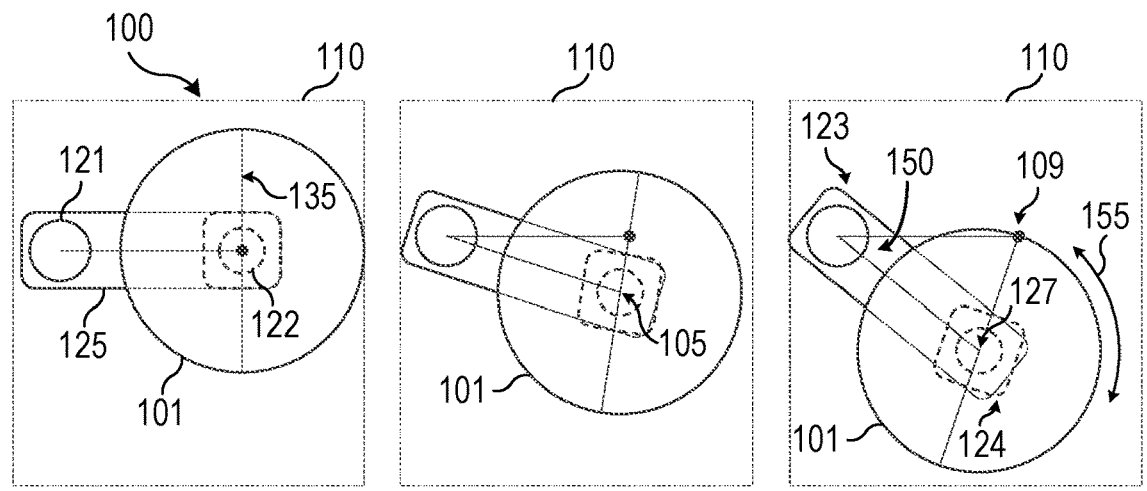
FIG. 1 illustrates three a schematic drawings of the top view of a substrate scanning apparatus that includes a rotary drive attached to the distal end of a pendulum arm in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Although substrate scanning processes that scan in only one dimension are possible, the following description relates specifically to substrate processing techniques that scan in at least two dimensions. For example, a processing apparatus may be configured to influence only a selected portion (e.g. a small region) of the substrate at a given moment in time (e.g. using a focused beam). The substrate may be moved laterally (i.e. scanned) relative to the processing apparatus (e.g. in a plane perpendicular to a beam generated by a nozzle). In this way, location-specific processing of the substrate is achieved.

Substrate scanning apparatuses may be used for location-specific processing of a substrate. Substrate scanning apparatuses may also be used for other applications such as integrated photonics and microelectromechanical system (MEMS), as well as for imaging (e.g., scanning electron microscopy (SEM) and atomic force microscopy (AFM)).

Location-specific processing may be applied to a variety of substrate processing techniques such as etching, stripping, cleaning, particle removal, deposition, and implantation, among others. For example, location-specific processing may be advantageously applied to gas cluster ion beam (GCIB) processing. Another example application where location-specific processing may be advantageous is for plasma etching processes that are configured to etch only a portion of the substrate. Other applications of location-specific processing may include cleaning processes that utilize a stream of fluid or gas. Location-specific processing may advantageously enable highly accurate amounts of addition or subtraction to selected regions of the substrate.

Location-specific processing may be used for GCIB processing. For example, during a GCIB process step, a substrate (e.g. a wafer) may be scanned through a particle beam to expose the substrate surface uniformly to the beam. The particle beam comprises a wide distribution of clusters of a few thousand to a few atoms/molecules (even monomers). The particle beam cross-section is usually small relative to the area of the substrate surface. Hence, during GCIB processing, a substrate scanning apparatus may be used to expose a portion of the substrate surface or the entire substrate surface to the particle beam. Rather than move the GCIB source (e.g. a nozzle), the substrate may be mechanically moved through a stationary beam to avoid problems in controlling the spot size and shape during electrostatic scanning of high current ion beams.

Conventional substrate scanning apparatuses such as those used for GCIB processing have large mechanisms which may also be located to the side of the substrate. For example, the substrate may be cantilevered out relatively far from axes of rotation that drive substrate motion. These large mechanisms are often located in large vacuum chambers that include the substrate. Such large chambers have several disadvantages compared to smaller chambers. Large chambers are inherently more expensive to manufacture. They require larger, more expensive pumps. Larger chamber sizes result in higher tool footprint and greater tool weight. They require more complex automation schemes to deliver wafers within multi-chamber cluster tools. Large chamber sizes also increase the difficulty of integrating a process technology with other processing technologies that utilize smaller vacuum chambers within the same cluster tool.

Raster patterns can also be varied between different scanning mechanisms. Some raster patterns such as a spiral raster pattern may allow the chamber size to be reduced by decreasing the size of the scanning mechanism. For example, an arc motion may be used in some substrate scanning apparatus designs to move the substrate through an angular arc as opposed to moving the substrate along a linear path. The arc motion may be combined with substrate rotation to effectively create a spiral raster pattern over the processed area, moving from one edge of the substrate to the center and then, if desired, either reversing arc motion direction and moving back to the same side of the substrate or progressing past the center to the opposite side of the rotating substrate.

Due to the spiral raster pattern, the lateral velocity as controlled by the angular velocity of the arc motion is increased as the center of the substrate moves towards the localized processing region (e.g. the spot on the substrate surface generated by a nozzle) in order to provide equal residence time across the substrate. However, to achieve a perfectly even residence time would require infinite arc angular velocity when passing through the center. Consequently, a practical upper limit on the angular velocity must be used for spiral raster patterns in order to provide effective control. The resulting longer residence time at and near the substrate center compared to other regions of the substrate causes undesirable over-processing at the center that does not work well for any process where high accuracy for additive or subtractive processes is required.

The following embodiments advantageously achieve increased accuracy of processing afforded by larger scanning mechanisms along with reduced chamber size enabled using arc motion of the substrate.

Figure 2:
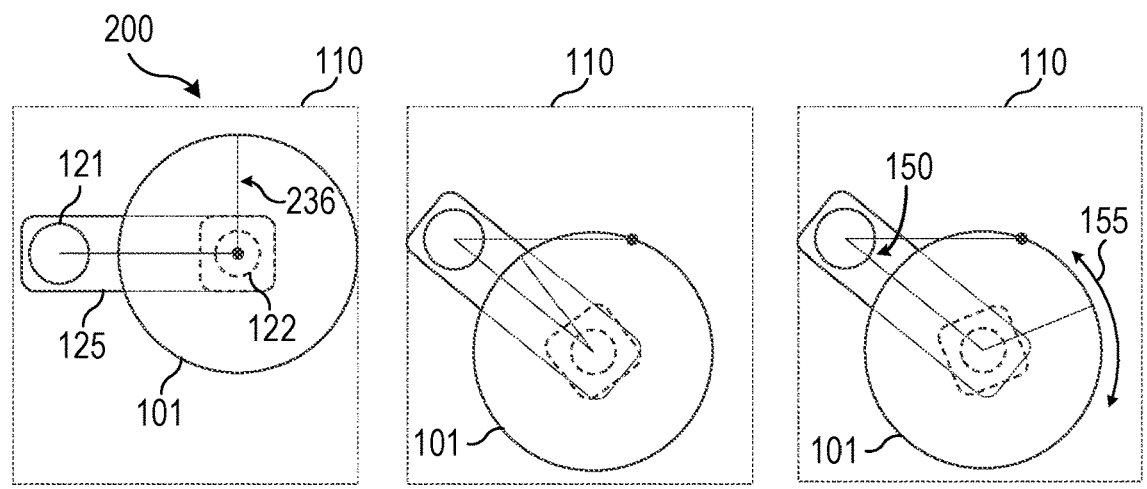
FIG. 2 illustrates three more schematic drawings of the top view of a substrate scanning apparatus that includes a rotary drive attached to the distal end of a pendulum arm in accordance with an embodiment of the invention.

Embodiments provided below describe various systems, apparatuses and methods for substrate scanning, and in particular, substrate scanning that includes a rotatable substrate holder attached at the distal end of a pendulum arm. The following description describes the embodiments. FIGS. 1 and 2 are used to describe an embodiment substrate scanning apparatus. An embodiment parallel raster pattern is described using FIG. 3. An example of the motion of a pendulum arm of an embodiment substrate scanning apparatus is described using FIG. 4. A geometric diagram of an embodiment substrate scanning apparatus is described using FIG. 5. FIGS. 6 and 7 are used to describe to two embodiment substrate scanning apparatuses with different nozzle configurations. Another embodiment substrate scanning apparatus is described using FIGS. 8 and 9. Three embodiment substrate scanning processes that scan an entire substrate in two separate steps are described using FIGS. 10, 11A and 11B. An embodiment substrate scanning apparatus is shown in a side view and described using FIG. 12. FIG. 13 is used to describe an embodiment substrate scanning system. An embodiment substrate scanning method is described using FIG. 14.

FIG. 1 illustrates three a schematic drawings of the top view of a substrate scanning apparatus that includes a rotary drive attached to the distal end of a pendulum arm in accordance with an embodiment of the invention.

Referring to FIG. 1, a substrate scanning apparatus 100 includes a substrate 101 disposed in a processing chamber 110. A pendulum arm 125 is also at least partially disposed in the processing chamber 110. The pendulum arm 125 includes a proximal end 123 and a distal end 124. The proximal end 123 is coupled to a first rotary drive 121. The first rotary drive is configured to move the pendulum arm 125 in an arc motion 150 centered at the proximal end 123 of the pendulum arm 125.

The substrate 101 is coupled to a second rotary drive 122 at a pivot point 127. In some embodiments, the pivot point 127 is at the center 105 of the substrate 101 (as shown). In other embodiments, the pivot point 127 is offset from the center 105 of the substrate 101. The second rotary drive 122 is mounted at the distal end 124 of the pendulum arm 125 and is configured to rotate the substrate 101 (via a substrate holder, for example) about the pivot point 127 synchronously with the arc motion 150 of the pendulum arm 125 to move the substrate 101 laterally relative to a location-specific apparatus.

The location-specific apparatus (such as a location-specific processing apparatus or a raster imaging apparatus) is focused at a localized spot 109 on the substrate 101. Scanning of the substrate 101 may enable location-specific processing of the substrate 101 using the localized spot 109. However, substrate scanning may also be used for a variety of other techniques such as imaging techniques, for example. In applications such as imaging the processing chamber 110 may be referred to simply as a scanning chamber, but it should be noted that, for the purposes of this description, a processing chamber may be considered a scanning chamber when the scanning mechanism is included in the processing chamber.

The combination of the arc motion 150 of the pendulum arm 125 and the rotation 155 of the substrate 101 at the distal end 124 advantageously allows for highly accurate control of the localized spot 109 at the substrate 101 as well as complete access to the entire surface of the substrate 101. For example, the embodiments described herein have the benefit of enabling accurate scanning (i.e. scanning along parallel paths such as straight line 135) of the substrate. Although any pattern is possible, linear scans that include parallel straight or substantially straight lines may be desirable for many reasons such as improved consistency in both dwell time and the size and shape of exposed regions as well as more accurate fine control over position. The three schematic diagrams shown in FIG. 1 demonstrate the ability of the substrate scanning apparatus wo to reach all regions of the straight line 135 through the center 105 of the substrate 101.

Figure 3:
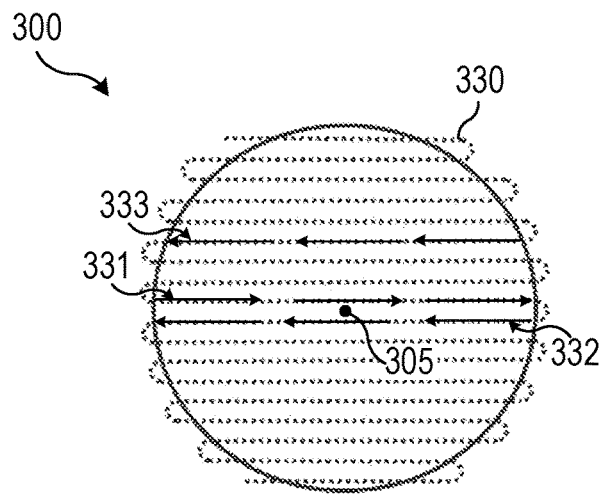
FIG. 3 illustrates a top view of a parallel raster pattern superimposed over a substrate in accordance with an embodiment of the invention.

As shown, the localized spot 109 may pass directly over the center 105 of the substrate 101, but this is not required. For example, the localized spot 109 may also be shifted by half the spot size allowing the center 105 to be evenly exposed without passing directly over it. Such a configuration is illustrated in FIG. 3, for example. The localized spot 109 may also be shifted further away or closer to the proximal end 123 of the pendulum arm 125 depending on the specifics of a given application. The location of the localized spot 109 relative to the first rotary drive 121 and the second rotary drive 122 may impact the required range of motion of the scanning mechanisms and the ability to scan the entire substrate.

As mentioned above, the substrate 101 may be immobilized on a substrate holder (which is not illustrated in certain figures for simplicity). Although the substrate holder may be any suitable size, it can be assumed to be substantially coextensive with the substrate 101 unless otherwise described. By extension, unless otherwise described, the center 105 of the substrate 101 is the center of the substrate holder.

The substrate 101 may be any suitable substrate (or even an empty substrate holder) for which scanning of an exposed surface is desired. In various embodiments, the substrate 101 is a wafer and is a silicon wafer in one embodiment. More possible substrates include flat panel displays, photolithography masks, and others. Although the many substrates are circular, there is not requirement that the substrate 101 be circular or even substantially circular. For example, the substrate 101 may be circular, square, rectangular, or any other desired shape including irregular shapes.

In various embodiments, the processing chamber no is a vacuum chamber capable of maintaining a pressure lower than the surrounding atmospheric pressure. In some embodiments, the processing chamber no is configured to maintain a high vacuum environment and is configured to maintain an ultra-high vacuum in one embodiment. Although holding a vacuum is frequently advantageous for many applications, there is no limitation on the ability of the processing chamber no to hold a certain level of vacuum. However, the embodiments described herein may advantageously allow for increased sealing of embodiment processing chambers and improved cleanliness during operation of embodiment substrate scanning apparatuses due to the small form factor and contained configuration of the scanning mechanisms.

In one embodiment, the pendulum arm 125 is located fully within the processing chamber 110. In other embodiments, part of the pendulum arm 125 may pass through a feedthrough into the processing chamber 110. The pendulum arm 125 is longer than the radius of the substrate 101 (or half the largest dimension of a noncircular substrate). As illustrated, the compact nature of the pendulum arm 125 may advantageously reduce the required footprint of the processing chamber no compared to conventional bulky scanning mechanisms. In some applications, the pendulum arm 125 may be made longer (e.g. to improve control or reduce angular velocity at the substrate). However, the footprint may still be kept relatively small due to the combination of arc motion 150 of the pendulum arm 125 and the rotation 155 of the substrate 101.

FIG. 2 illustrates three more schematic drawings of the top view of a substrate scanning apparatus that includes a rotary drive attached to the distal end of a pendulum arm in accordance with an embodiment of the invention. The schematic drawings of FIG. 2 represent different views of a similar configuration as that described above using FIG. 1. The different views further demonstrate the ability of this configuration to reach all regions of the substrate. Similarly labeled elements are as previously described.

Referring to FIG. 2, a substrate scanning apparatus 200 includes a substrate 101 that is illustrated with a guide line 236 to indicate the orientation of the substrate 101. It should be noted that here and in the following a convention has been adopted for brevity and clarity wherein elements adhering to the pattern [x00] may be related implementations of a substrate scanning apparatus in various embodiments. For example, the substrate scanning apparatus 200 may be similar to the substrate scanning apparatus 100 except as otherwise stated. An analogous convention has also been adopted for other elements as made clear by the use of similar terms in conjunction with the aforementioned numbering system.

The guide line 236 serves to help visualize the mapping of the arc motion and rotation system onto the entire surface of the substrate 101. For example, the substrate 101 may be swung out in the arc motion 150 until the localized spot 109 is at or off the edge of the substrate 101. While the substrate 101 traversing the arc, the localized spot 109 continuously exposes the substrate 101 from the center 105 to the edge. At any point along the way, the arc motion 150 could be stopped and the substrate 101 could undergo the rotation 155 in order to reach any point on the substrate 101.

FIG. 3 illustrates a top view of a parallel raster pattern superimposed over a substrate in accordance with an embodiment of the invention. The substrate of FIG. 3 may be a specific implementation of other substrates described herein such as substrate 101 of FIG. 1, for example.

Referring to FIG. 3, a parallel raster pattern 330 is illustrated superimposed over a substrate 300 to show how such a pattern might cover the entire substrate 300. The parallel raster pattern 330 includes a series of parallel paths that, in the aggregate, entirely cover the region of the substrate 300 that is to be scanned. Although there is no limitation on the specific pattern that may be used, in some embodiments, the parallel raster pattern is a linear raster pattern including a series of parallel straight (or substantially straight) lines that extend from one side of the substrate 300 to the other as shown. Each section of the parallel raster pattern 330 extending from one side of the substrate 300 to the other may be referred to as a pass 333. The parallel raster pattern 330 may not change direction while over the substrate 300 (as illustrated). While not a strict requirement, this may have the advantage of ensuring very consistent exposure of the substrate 300 during scanning.

For this particular implementation of a parallel raster pattern, each consecutive pass of the parallel raster pattern 330 travels the opposite direction as the previous pass. For example, a first pass 331 may be scanned from left to right as shown so that a second pass 332 is scanned from right to left and so on. Although the parallel raster pattern 330 may begin at the end points of the path, it may also begin at any point in the middle (e.g. when scanning half of the substrate at a time which is discussed later on). It should also be noted that the parallel raster pattern 330 may or may not pass directly through the center 305 of the substrate 300 due to the finite (often Gaussian) nature of the spot size.

Although the parallel raster pattern 330 is shown and described as covering the entire substrate 300, partial coverage as well as partial processing is also possible. For example, the processing apparatus may be switched off for some portions of the pattern in order to only process certain regions of the substrate 300. Similarly, parameters of the substrate process (e.g. intensity, duration, etc.) may be changed in real time during scanning to alter processing at various portions of the substrate relative to other portions of the substrate. In some cases, a partial raster pattern may be used (e.g. if locations on the substrate requiring processing are grouped together or represent a relatively small fraction of the total substrate area.

This ability to dynamically vary processing parameters while scanning in combination was only scanning portions of a substrate may advantageously allow targeted processing of specific areas of the substrate (e.g. that were identified as have correctable defects or that need to be processed without harming other portions of the substrate, etc.)

Figure 4:
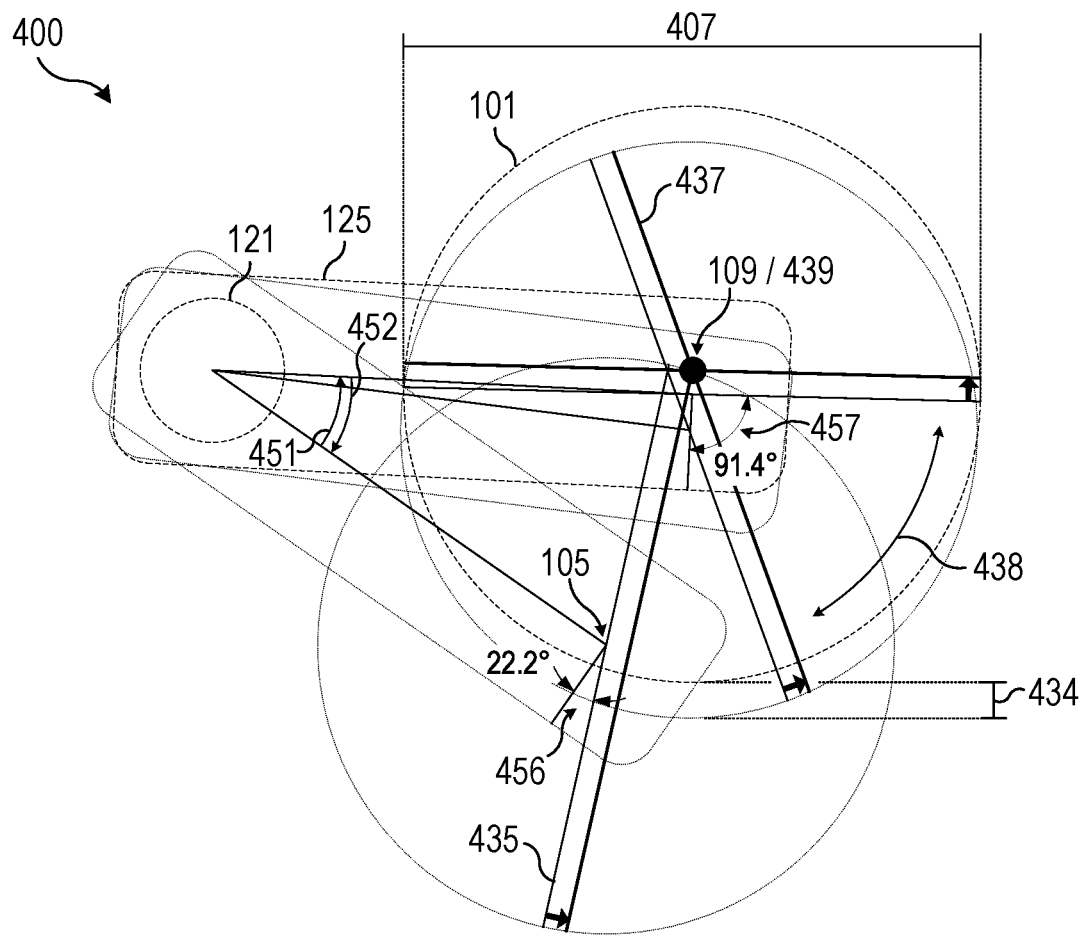
FIG. 4 illustrates a schematic diagram of the motion of a pendulum arm and a substrate in accordance with an embodiment of the invention.

FIG. 4 illustrates a schematic diagram of the motion of a pendulum arm and a substrate in accordance with an embodiment of the invention. The schematic diagram of the substrate of FIG. 4 may represent a specific configuration of other substrates described herein such as substrate 101 of FIG. 1, for example. Similarly labeled elements may be as previously described.

Referring to FIG. 4, a schematic diagram 400 shows a substrate 101 in various positions of arc motion and rotation. The schematic diagram 400 demonstrates how the substrate 101 and the pendulum arm 125 move when following an off-center straight line 437 that is not through the center 405 of the substrate 101. As before, the substrate 101 is coupled to the distal end of the pendulum arm 125. A straight line 435 is drawn through the center 405 along with the thicker off-center straight line 437 and a thick arrow to indicate orientation of the substrate 101 as it rotates.

At the lowest illustrated position, the localized spot 109 is at the edge of the substrate 101 on the off-center straight line 437. The position of the pendulum arm 125 results in a first rotation 456 counterclockwise 22.2° to bring the end of the off-center straight line 437 to the localized spot 109. As the substrate 101 on the pendulum arm 125 is moved in a first arc motion 451 towards the localized spot 109 the substrate 101 continues to rotate counterclockwise with ever-increasing angular velocity. For example, between the two upper positions, the substrate 101 only undergoes a small (approximately) linear movement 434 but the second rotation 457 moves through a large angular movement 438.

At the upper position, the localized spot 109 is at the midpoint 439 of the off-center straight line 437. At this point, either the arc motion or the substrate rotation can continue in the same direction while the other continues in the same direction. If the arc motion were to continue past this point the rotation would have to instantaneously stop and rotate the opposite direction. This may be much less practical than the alternative since the arc motion naturally slows as it approaches the midpoint 409 while the rotational motion makes up for the reduction in arc motion to maintain a constant scan rate.

Consequently, it may be advantageous to for the arc motion to change direction during each pass of a parallel raster pattern that does not pass through the middle. Scans that pass directly through the middle allow both the arc motion and the rotation to maintain their direction. Therefore, the pendulum arm 125 may change direction at the midpoint 439 and follow a second arc motion 452 in order to complete a linear pass along an off-center straight line.

For clarity, substrate 101 has not been illustrated as traveling through the second half of the pass. Since the off-center straight line 437 is so close to the center 405, the return motion of the substrate 101 is fairly symmetric. In should be noted that the second arc motion 452 is shown as symmetric, but this is only an approximation as it is asymmetric. Indeed, the farther away from the center 405 the pass is, the less symmetric the return trip becomes.

Additionally, changing arc motion direction may have the further advantage of reducing the necessary footprint of the processing chamber if only half of the substrate 101 needs to be processed. As will be discussed in reference to FIGS. 10, 11A and 11B, there are configurations that can scan the entire substrate in a similar limited footprint.

The substrate diameter 407 affects the extent of the required arc motion away from the origin. For example the proportionality shown is of a 150 mm substrate radius (300 mm substrate diameter 407) and a 250 mm pendulum arm 125. The specific proportions for a given application may depend on a variety of factors such as acceleration and velocity limitations, desired or required processing chamber footprint, and extent of the substrate requiring processing. In general, increasing the pendulum arm length decreases the required angular range of the arc motion which reduces the footprint in one dimension, but it increases the footprint in the other dimension due to the extension of the pendulum arm.

It should be noted that although the present description focuses on the ability of the scanning mechanisms to reach all portions of a substrate and trace out raster patterns composed of straight lines, any raster pattern is possible using the substrate scanning embodiments described herein. For example, the substrate scanning methods, apparatuses, and systems as described herein are equally capable of raster patterns that include curves or trace out arbitrary patterns as desired for a given application. That is, the improvements afforded by a pendulum arm in combination with a rotatable substrate such as decreased tool footprint and high accuracy are equally applicable to other raster patterns.

Figure 5:
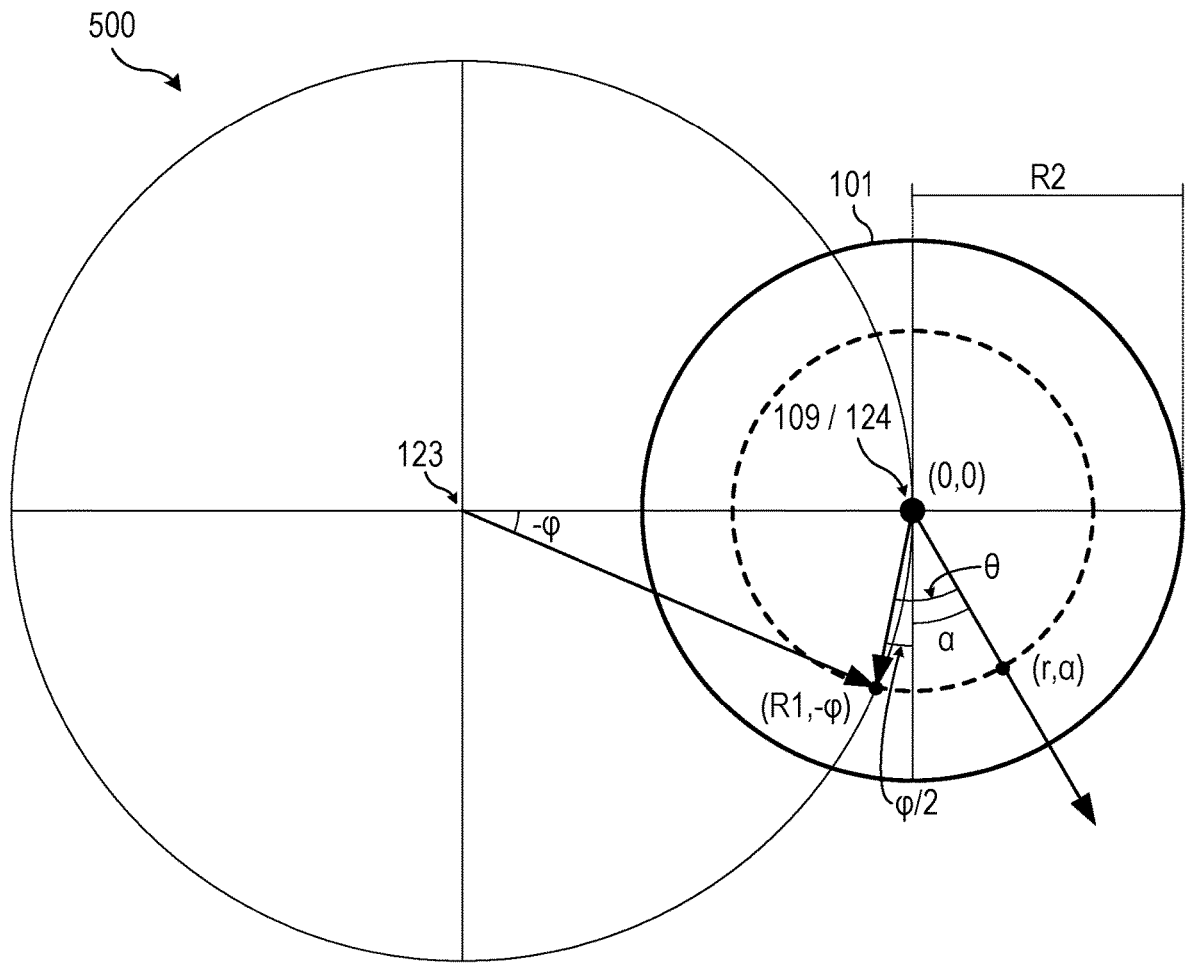
FIG. 5 illustrates a geometric diagram of the motion of a substrate relative to a stationary location-specific processing apparatus in accordance with an embodiment of the invention.

FIG. 5 illustrates a geometric diagram of the motion of a substrate relative to a stationary location-specific processing apparatus in accordance with an embodiment of the invention. The geometric diagram of the substrate of FIG. 5 may represent a specific configuration of other substrates described herein such as substrate 101 of FIG. 1, for example. Similarly labeled elements may be as previously described.

Referring to FIG. 5, a geometric diagram 500 shows a substrate 101 centered at a position on the edge of a large circle of radius R1. The radius R1 is the length of the pendulum arm. Similarly, the radius R2 is the substrate radius. The diagram indicates the angles for the arc motion $\varphi$ and the rotation $\theta$ necessary to move the point (r,α) to the localized spot 109 at (0,0).

Since $\varphi$ is the apex angle of an isosceles triangle, $\theta - \alpha = \varphi/2$. Assuming we know the coordinates (r,α) of the point we wish to scan, we can determine the rotation $\varphi$ from $\varphi = 2 \arcsin(r/R1/2)$ and then use the previous equation to solve for the arc motion $\theta$. For example, in the lowest position of FIG. 4, (r,α)=(150 mm, 4.8°) and R1=250 mm resulting in $\varphi = 34.9°$ (and $\theta = 22.2°$.

As discussed in reference to FIG. 4, the angular acceleration and velocity of the substrate increase dramatically near the midpoint for lines that at close but not through the center of the pivot point. In many applications this does not pose a problem. However, in some applications, it may be difficult to manage such high angular acceleration and velocity particularly if the spot size is small. FIGS. 6-10, 11A, and 11B provide various embodiments that address this potential issue.

FIG. 6 illustrates a schematic diagram of the top view of a substrate scanning apparatus that includes two or more static processing nozzles in accordance with an embodiment of the invention. The substrate scanning apparatus of FIG. 6 may be a specific implementation of other substrate scanning apparatuses described herein such as the substrate scanning apparatus of FIG. 1, for example. Similarly labeled elements are as previously described.

Referring to FIG. 6, a substrate scanning apparatus 600 includes a substrate 101 disposed in a processing chamber 610, similar to the substrate scanning apparatus 100 of FIG. 1. However, in contrast to FIG. 1, the substrate scanning apparatus 600 includes two or more static processing nozzles including a first static processing nozzle 661 and a second static processing nozzle 662 disposed at different distances 667 from the first rotary drive 121. The multiple static processing nozzles may be advantageously used to scan different portions of the substrate in order avoid scanning too close to the center of the substrate.

FIG. 7 illustrates a schematic diagram of the top view of a substrate scanning apparatus that includes a translational processing nozzle in accordance with an embodiment of the invention. The substrate scanning apparatus of FIG. 7 may be a specific implementation of other substrate scanning apparatuses described herein such as the substrate scanning apparatus of FIG. 1, for example. Similarly labeled elements are as previously described.

Referring to FIG. 7, a substrate scanning apparatus 700 includes a substrate 101 disposed in a processing chamber 710, similar to the substrate scanning apparatus 100 of FIG. 1. However, in contrast to FIG. 1, the substrate scanning apparatus 700 includes a single translatable processing nozzle 763 that may be moved between different distances 667 from the first rotary drive 121. The multiple processing nozzles may be advantageously used to scan different portions of the substrate in order avoid scanning too close to the center of the substrate.

It should be mentioned that there is a difference between a static processing nozzle and a nozzle that stationary during some portion of a process. For the purposes of this disclosure, a static nozzle does not move relative to the substrate scanning apparatus itself (other than potentially for calibration and maintenance reasons) while a stationary nozzle may be either a static or translational (i.e. movable) nozzle.

FIG. 8 illustrates three schematic diagrams of the top view of a substrate scanning apparatus that includes a rotary drive attached at a distal end of a pendulum arm and a substrate attached to the rotary drive at a pivot point offset from the center of the substrate in accordance with an embodiment of the invention. The substrate scanning apparatus of FIG. 8 may be a general implementation of other substrate scanning apparatuses described herein such as the substrate scanning apparatus of FIG. 1, for example. Similarly labeled elements are as previously described.

Referring to FIG. 8, a substrate scanning apparatus 800 is similar to the substrate scanning apparatus 100 of FIG. 1, except that the pivot point 827 of the second rotary drive 822 is offset from the center of the substrate 101 an offset distance d that is less than the outer radius of the substrate (and substrate holder). As shown in the three schematic diagrams, the footprint of the processing chamber 810 is increased slightly as a result of the rotation 855 having a longer reach. However, similar to the on-axis embodiments, previously described, the off-axis configuration still advantageously reaches all parts of the substrate 101 within a small footprint.

The offset distance d may be appropriately chosen to balance the benefits of a small processing chamber footprint with the angular acceleration and velocity requirements of a given process. The offset distance d may have the advantage of being small due to the rapid drop off in angular velocity and acceleration for lines as they move away from the center.

FIG. 9 illustrates three more schematic diagrams of the top view of a substrate scanning apparatus that includes a rotary drive attached at a distal end of a pendulum arm and a substrate attached to the rotary drive at a pivot point offset from the center of the substrate in accordance with an embodiment of the invention. The schematic drawings of FIG. 9 represent different views of a similar configuration as that described above using FIG. 8. The different views further demonstrate the ability of this configuration to reach all regions of the substrate. Similarly labeled elements are as previously described.

Referring to FIG. 9, a substrate scanning apparatus 900 includes a substrate 101 that is illustrated with a guide line 936 to indicate the orientation of the substrate 101. Similar to guide line 236, the guide line 936 serves to help visualize the mapping of the arc motion and rotation system onto the entire surface of the substrate 101.

Figure 10:
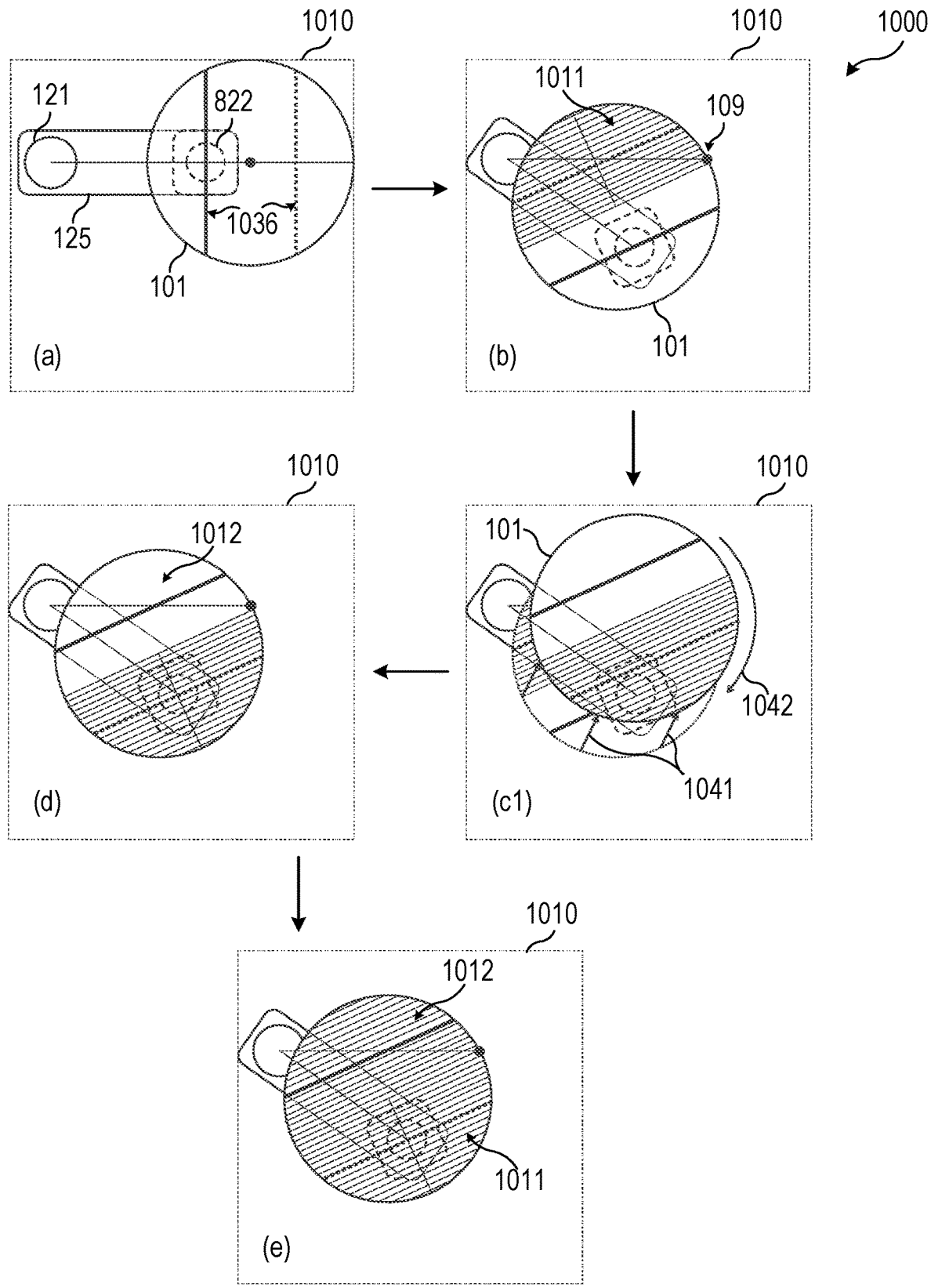
FIG. 10 illustrates a substrate scanning process in which a substrate is lifted off a substrate holder and rotated 180° in accordance with an embodiment of the invention.

FIG. 10 illustrates a substrate scanning process in which a substrate is lifted off a substrate holder and rotated 180° in accordance with an embodiment of the invention. The substrate scanning process of FIG. 10 may be performed using substrate scanning apparatuses described herein such as the substrate scanning apparatus of FIG. 8, for example. Similarly labeled elements are as previously described.

Referring to FIG. 10, a substrate scanning process 1000 includes 5 steps labeled (a), (b), (a), (d), and (e). In step (a) a processing chamber 1010 is shown that includes a substrate 101 that is offset from the second rotary drive 822 and includes guide lines 1036 to show rotation in subsequent steps.

In step (b), a first processing region 1011 is scanned. The first processing region 1011 is includes at least half of the surface of the substrate 101. In step (c1), the substrate 101 is lifted up off of the substrate holder (using a lift mechanism such as lift pins 1041 or other physically protrudable supports, clamps, or arms, as examples). The substrate 101 then undergoes a 180° substrate rotation 1042. Then, in step (d) the remaining portion of the substrate 101 is scanned resulting in the entire surface of the substrate being scanned as shown in step (e) without the pendulum arm 125 crossing the midpoint. Therefore, advantageously the whole surface of the substrate 101 is scanned without increasing the footprint of the processing chamber.

Figure 11A:
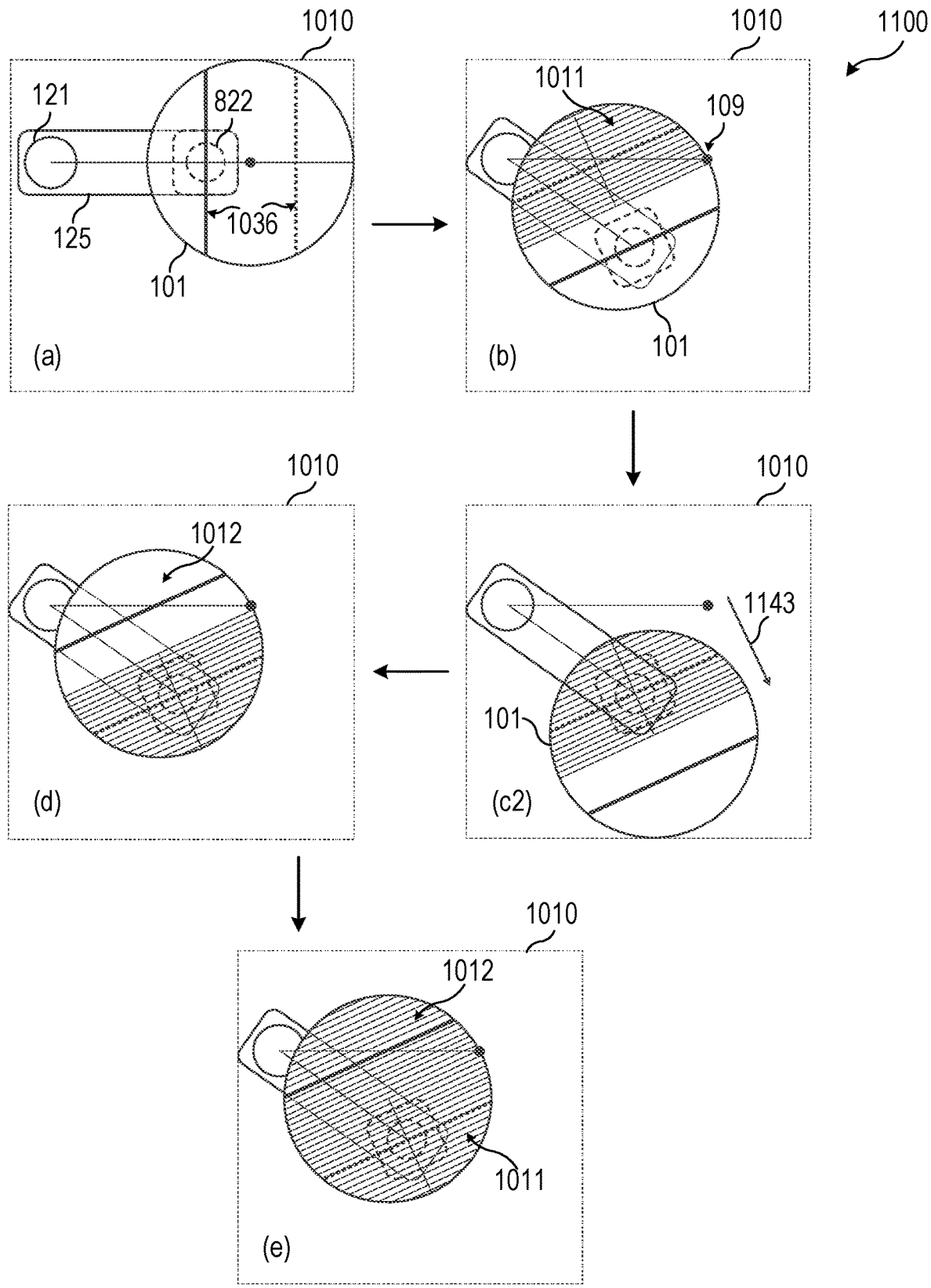
FIG. 11A illustrates a substrate scanning process in which the pivot point of the rotatable substrate is shifted by linearly translating the substrate relative to a pivot point in accordance with an embodiment of the invention.

FIG. 11A illustrates a substrate scanning process in which the pivot point of a rotatable substrate is shifted by linearly translating the substrate relative to a pivot point in accordance with an embodiment of the invention. The substrate scanning process of FIG. 11A may be performed using substrate scanning apparatuses described herein such as the substrate scanning apparatus of FIG. 8, for example. Similarly labeled elements are as previously described.

Referring to FIG. 11A, a substrate scanning process 1100 includes 5 steps labeled (a), (b), (c2), (d), and (e). All steps except (c2) are as previously described. In step (c2), instead of lifting the substrate 101 off of the substrate holder and rotating the substrate 101, the substrate is linearly translated (e.g. slides) relative to the pivot point in order to provide the same effect. The translation may be realized using an actuator such as a linear actuator that is included in the pendulum arm 125. Not lifting the substrate up to change positions may advantageously reduce complexity and improve alignment.

Figure 11B:
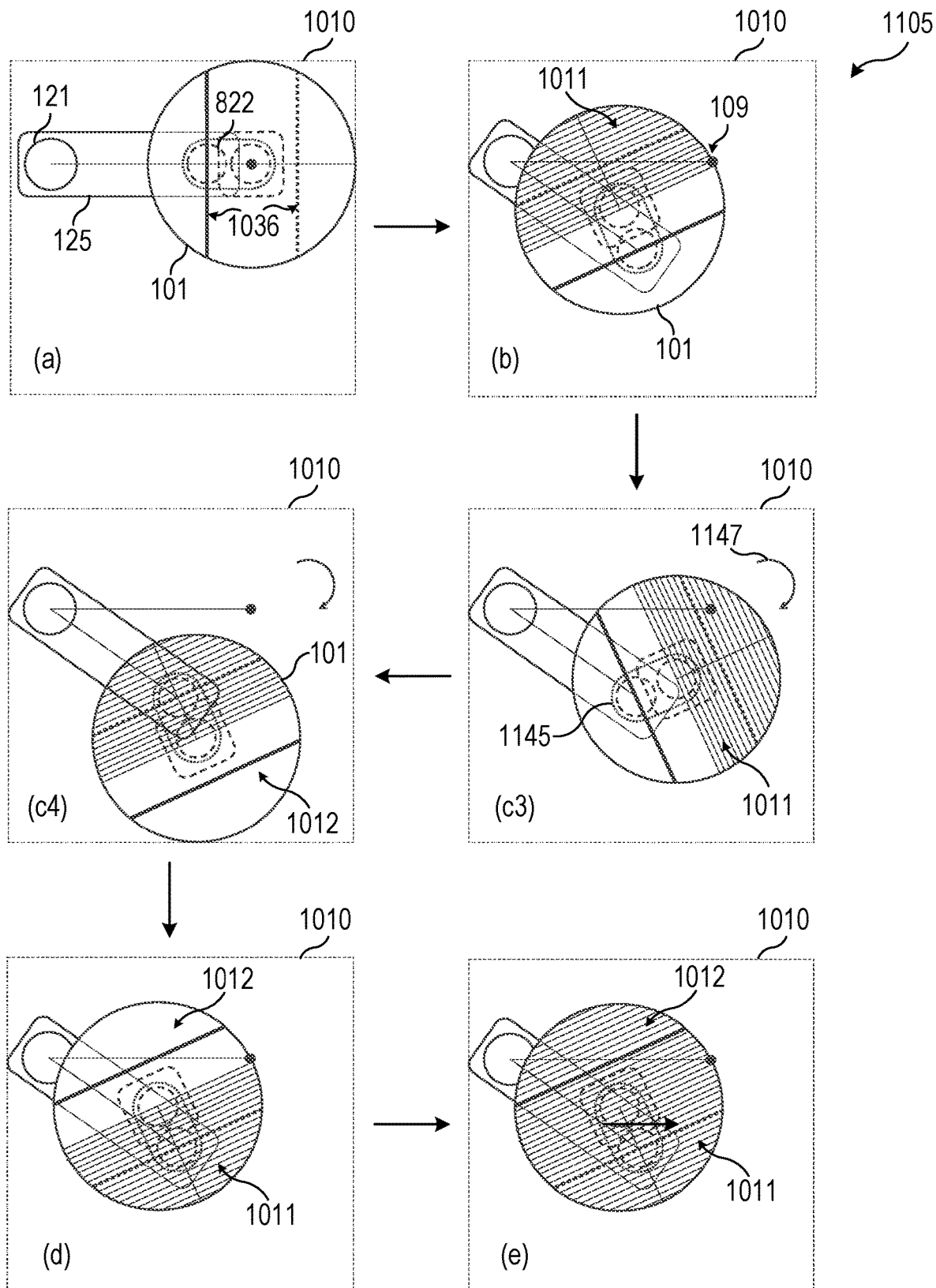
FIG. 11B illustrates a substrate scanning process in which the pivot point of a rotatable substrate is shifted by rotationally translating the substrate relative to a pivot point in accordance with an embodiment of the invention.

FIG. 11B illustrates a substrate scanning process in which the pivot point of a rotatable substrate is shifted by rotationally translating the substrate relative to a pivot point in accordance with an embodiment of the invention.

Referring to FIG. 11B, a substrate scanning process 1105 includes 6 steps labeled (a), (b), (c3), (c4), (d), and (e). All steps except (c3) and (c4) are as previously described. In steps (c3) and (c4), instead of lifting the substrate 101 off of the substrate holder or linearly translating the substrate 101 physically, the substrate 101 is instead rotated 1147 about the pivot point using a rotational mechanism 1145 (e.g. a belt may be used) in order to provide the same effect. As with a linear translation, not lifting the substrate up to change positions may advantageously reduce complexity and improve alignment.

Figure 12:
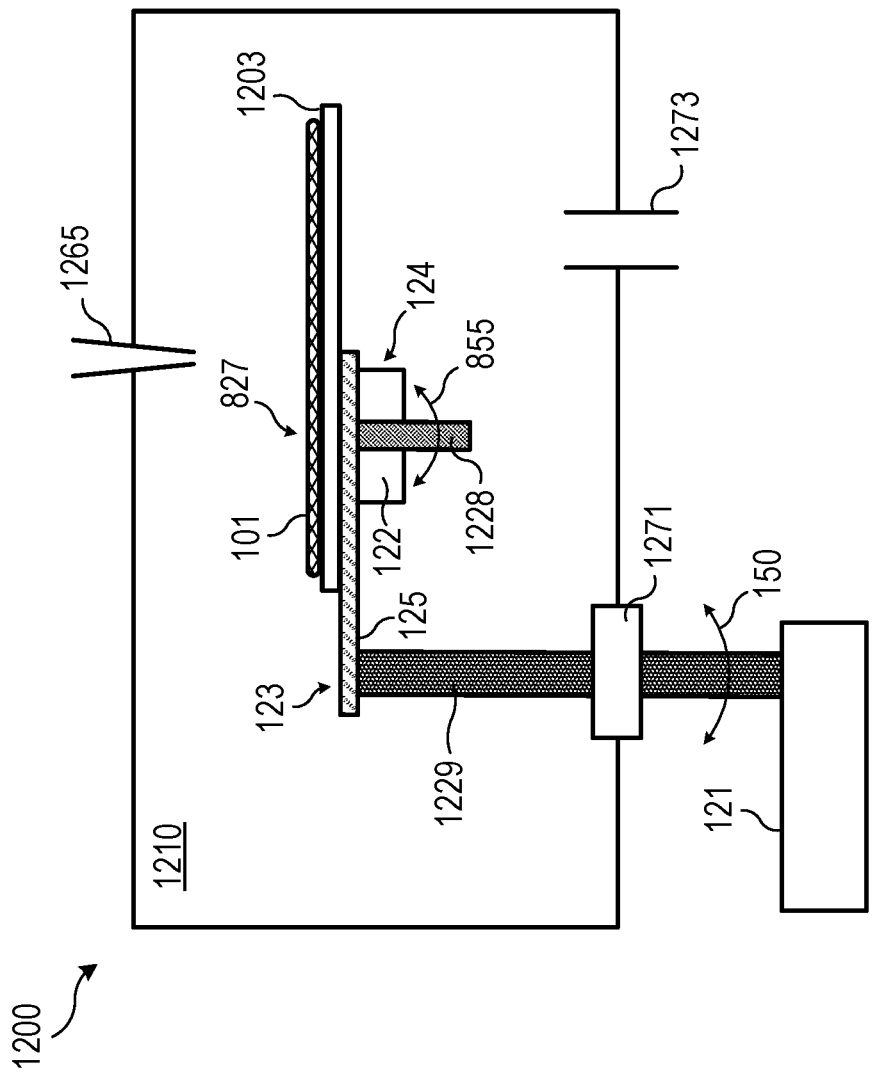
FIG. 12 illustrates a schematic diagram of a side view of a substrate scanning apparatus in accordance with an embodiment of the invention.
Figure 13:
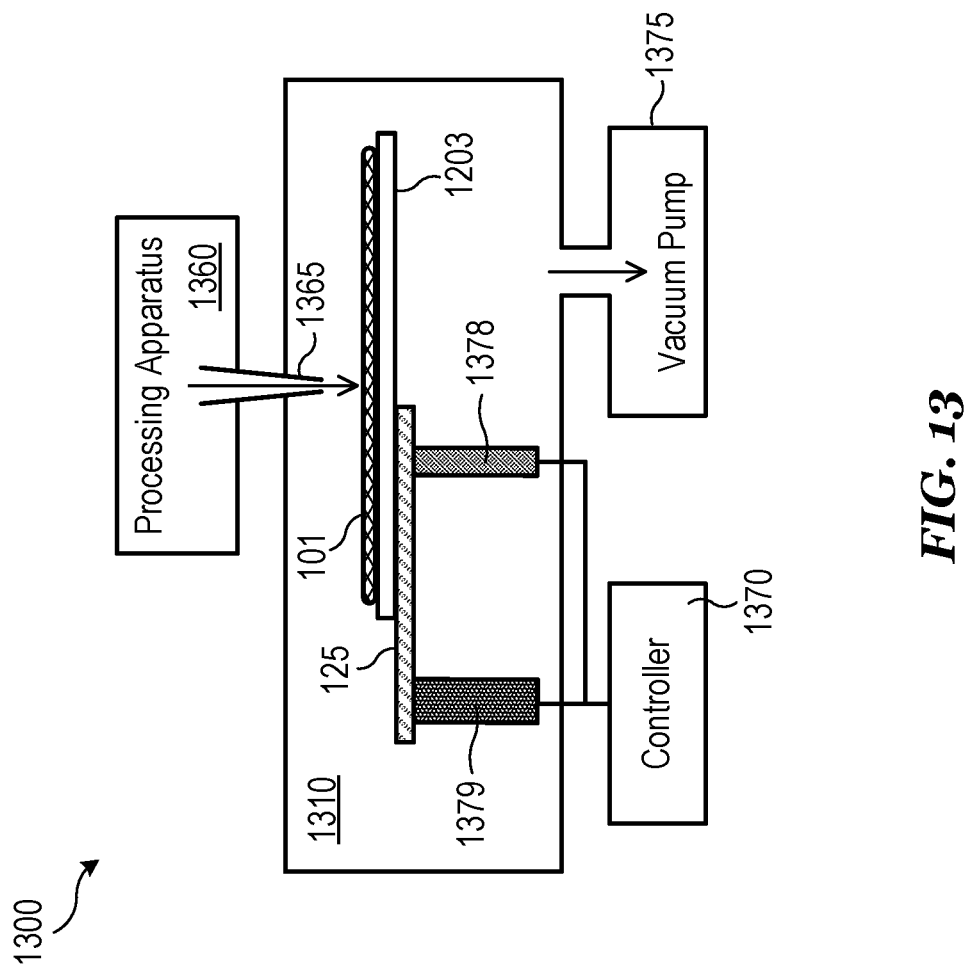
FIG. 13 illustrates a schematic diagram of a side view of a substrate scanning system in accordance with an embodiment of the invention.

FIG. 12 illustrates a schematic diagram of a side view of a substrate scanning apparatus in accordance with an embodiment of the invention. The substrate scanning apparatus of FIG. 12 may be a specific implementation of other substrate scanning apparatuses described herein such as the substrate scanning apparatuses of FIG. 1 or FIG. 8, as examples. Similarly labeled elements are as previously described.

Referring to FIG. 12, a substrate scanning apparatus 1200 includes a processing chamber 1210 comprising a processing nozzle 1265 and an exhaust port 1273. The processing nozzle 1265 is configured to focus a localize spot on the substrate 101 which is immobilized by a substrate holder 1203. Although shown as singular and static, the processing nozzle 1265 may also be switched out for one of the alternative nozzle embodiments of FIGS. 6 and 7 although the any nozzle will typically be stationary while actually processing the substrate.

The exhaust port 1273 is configured to facilitate a vacuum environment for the substrate scanning and processing. As shown, the pivot point 827 is located in a general location offset from the center of the substrate holder 1203 and the substrate 101, but the pivot point 827 could also be aligned with the center. A pivot point shaft 1228 is coupled to the second rotary drive 122 and the substrate holder at the distal end 124 of the pendulum arm 125. The pivot point shaft 1228 may couple the rotational motion of the second rotary drive 122 to the substrate holder 1203 and facilitate the rotation 855 of the substrate 101.

Similarly, a rotary feedthrough shaft 1229 is attached to the proximal end 123 of the pendulum arm 125 and coupled the rotational motion of the first rotary drive 121 to the pendulum arm 125 to enable the arc motion 150. In one embodiment, the rotary feedthrough shaft 1229 passes through the processing chamber 1210 at a vacuum feedthrough port 1271 which may further reduced the footprint of the processing chamber 1210 and improve cleanliness of scanning mechanism.

FIG. 13 illustrates a schematic diagram of a side view of a substrate scanning system in accordance with an embodiment of the invention. The substrate scanning system of FIG. 13 may include substrate scanning apparatuses described herein such as the substrate scanning apparatuses of FIG. 1, FIG. 8, or FIG. 12, as examples. Similarly labeled elements are as previously described.

Referring to FIG. 13, a substrate scanning system 1300 includes a processing apparatus 1360 coupled to a processing chamber 1310. Processing chamber 1310 houses a pendulum arm 125, a substrate holder 1203, and a substrate 101. A vacuum pump 1375 is coupled to the processing chamber 1310. A controller 1370 is operationally coupled to a pivot point access 1378 and an arc axis 1379 and is configured to control the simultaneous movement of the first and second rotary drives.

Figure 14:
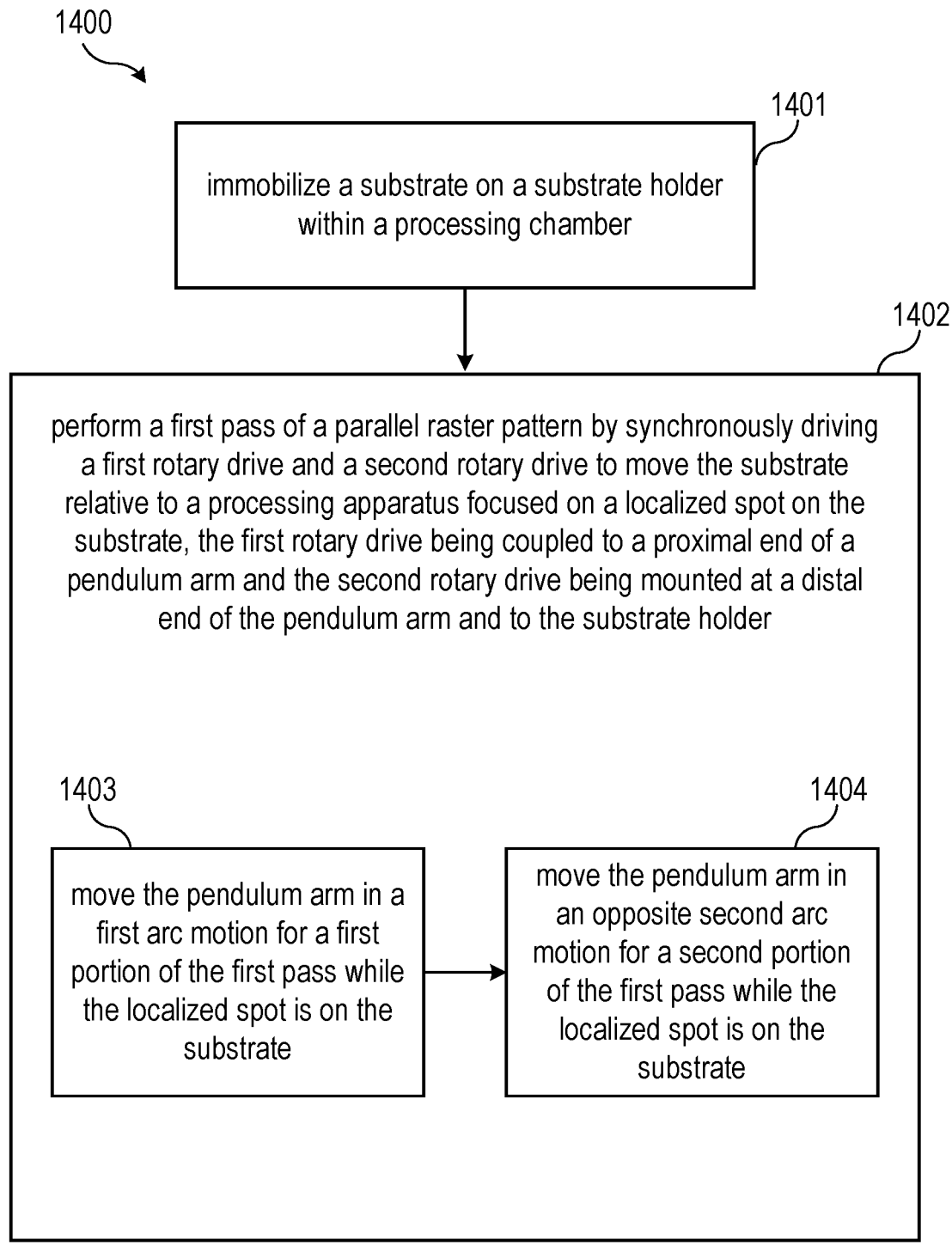
FIG. 14 illustrates a method of scanning a substrate in accordance with an embodiment of the invention.

FIG. 14 illustrates a method of scanning a substrate in accordance with an embodiment of the invention. The method of FIG. 14 may be combined with other methods and performed using the systems and apparatuses as described herein. For example, the method of FIG. 14 may be combined with any of the embodiments of FIGS. 1-13.

Referring to FIG. 14, a method 1400 includes a first step 1401 of immobilizing a substrate on a substrate holder within a processing chamber. In step 1402, a first pass of a parallel raster pattern is performed by synchronously driving a first rotary drive and a second rotary drive to move the substrate relative to a processing apparatus focused on a localized spot on the substrate. The first rotary drive is coupled to a proximal end of a pendulum arm and the second rotary drive is mounted at a distal end of the pendulum arm and to the substrate holder. For example, the first pass may begin at a first location off of the substrate, move onto the substrate, and end at a second location off of the substrate. However, neither beginning nor ending off the substrate is a requirement in all cases.

Step 1402 includes step 1403 and step 1404. Step 1403 and step 1404 are performed sequentially. The pendulum arm is moved in step 1403 during the first pass in a first arc motion for a first portion of the first pass while the localized spot is on the substrate. In step 1404, the pendulum arm is also moved during the first pass but in an opposite second arc motion for a second portion of the first pass while the localized spot is on the substrate. During step 1403 and step 1404 the substrate holder may be rotated in a single direction about a pivot point at the distal end of the pendulum arm.

Example embodiments of the invention are summarized here. Other embodiments can also be understood from the entirety of the specification as well as the claims filed herein.

Example 1. A method of scanning a substrate, the method including: immobilizing a substrate on a substrate holder within a processing chamber; and performing a first pass of a parallel raster pattern by synchronously driving a first rotary drive and a second rotary drive to move the substrate relative to a processing apparatus focused on a localized spot on the substrate, the first rotary drive being coupled to a proximal end of a pendulum arm and the second rotary drive being mounted at a distal end of the pendulum arm and to the substrate holder, where driving the first rotary drive during the first pass comprises moving the pendulum arm in a first arc motion for a first portion of the first pass while the localized spot is on the substrate, and then moving the pendulum arm in an opposite second arc motion for a second portion of the first pass while the localized spot is on the substrate.

Example 2. The method of example 1, where the pivot point is at the center of the substrate.

Example 3. The method of example 2, further including: performing a second pass of the parallel raster pattern by synchronously driving the first rotary drive and the second rotary drive, where the second pass is parallel to the first pass and passes through the center of the substrate, and driving the first rotary drive during the second pass comprises moving the pendulum arm through one continuous arc motion during the second pass.

Example 4. The method of example 1, where the pivot point is offset from the center of the substrate in a first direction by an offset distance that is less than half of the largest dimension of the substrate.

Example 5. The method of example 4, further including: performing subsequent second passes of the parallel raster pattern by synchronously driving the first rotary drive and the second rotary drive so that the localized spot has passed over at least half of the substrate; shifting the pivot point to be offset from the center of the substrate by the offset distance in a second direction opposite the first direction; and performing subsequent third passes of the parallel raster pattern by synchronously driving the first rotary drive and the second rotary drive so that the localized spot has passed over the entire substrate area.

Example 6. The method of example 5, where shifting the pivot point includes: lifting the substrate off of the substrate holder; rotating the substrate 180 degrees to a new position relative to the substrate holder; and immobilizing the substrate in the new position on the substrate holder.

Example 7. The method of example 5, where shifting the pivot point includes translating the substrate relative to the pivot point.

Example 8. The method of one of examples 1 to 7, further including: performing a second pass of the parallel raster pattern by synchronously driving the first rotary drive and the second rotary drive, where the location-specific processing apparatus includes a first static processing nozzle and a second static processing nozzle located at different distances from the proximal end of the pendulum arm, the second pass is parallel to the first pass, the substrate is processed using the first processing nozzle during the first pass, and the substrate is processed using the second nozzle during the second pass.

Example 9. The method of one of examples 1 to 7, further including: performing a second pass of the parallel raster pattern by synchronously driving the first rotary drive and the second rotary drive, where the location-specific processing apparatus includes a single processing nozzle translatable between two or more different distances from the proximal end of the pendulum arm, the second pass is parallel to the first pass, the substrate is processed using the single processing nozzle in a first position relative to the proximal end during the first pass, and the substrate is processed using the single processing nozzle in a second position relative to the proximal end during the second pass.

Example 10. A system including: a vacuum chamber; a first rotary drive coupled to a proximal end of a pendulum arm disposed in the vacuum chamber; a second rotary drive mounted at a distal end of the pendulum arm so that the second rotary drive moves with the distal end; a substrate holder disposed in the vacuum chamber and coupled to the second rotary drive at a pivot point; and a controller coupled to the first rotary drive and the second rotary drive, the controller being configured to synchronously drive the first rotary drive and the second rotary drive to cause a parallel raster pattern to be traced on the substrate holder by a stationary location-specific processing apparatus.

Example 11. The system of example 10, where the first rotary drive is disposed outside the vacuum chamber and coupled to the proximal end of the pendulum arm via a rotary feedthrough shaft.

Example 12. The system of one of examples 10 and 11, where the pivot point is at the center of the substrate.

Example 13. The system of example 12, where the location-specific processing apparatus includes two or more static processing nozzles located at different distances from the proximal end of the pendulum arm.

Example 14. The system of one of examples 12 and 13, where the location-specific processing apparatus includes a single processing nozzle translatable between two or more different distances from the proximal end of the pendulum arm.

Example 15. The system of one of examples 10 to 14, further including: a lift mechanism disposed on the substrate holder and configured to lift a substrate off of the substrate holder and rotate the substrate 180 degrees to a new position relative to the substrate holder.

Example 16. The system of one of examples 10 to 14, further including: an actuator coupled to the pivot point, the actuator configured to shift the pivot point by translating a substrate relative to the pivot point.

Example 17. An apparatus including: a processing chamber; a pendulum arm disposed in the processing chamber and including a proximal end and a distal end, the proximal end being coupled to a first rotary drive configured to move the pendulum arm in an arc motion centered at the proximal end; and a substrate holder disposed in the processing chamber and coupled to a second rotary drive at a pivot point that is offset from the center of the substrate holder in a first direction by an offset distance that is less than the outer radius of the substrate holder, the second rotary drive being mounted at the distal end of the pendulum arm and being configured to rotate the substrate holder about the pivot point synchronously with the arc motion of the pendulum arm to move the substrate holder laterally relative to a location-specific processing apparatus.

Example 18. The apparatus of example 17, where a major dimension of the processing chamber measured in the plane of the substrate holder is substantially equal to the sum of the length of the pendulum arm, the offset distance, and the outer radius of the substrate holder.

Example 19. The apparatus of one of examples 17 and 18, further including: a lift mechanism disposed on the substrate holder and configured to lift a substrate off of the substrate holder and rotate the substrate 180 degrees to a new position relative to the substrate holder.

Example 20. The apparatus of one of examples 17 and 18, further including: an actuator coupled to the pivot point, the actuator configured to shift the pivot point by translating a substrate relative to the pivot point.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
   a vacuum chamber;
   a first bidirectional rotary drive coupled to a proximal end of a pendulum arm disposed in the vacuum chamber;
   a second bidirectional rotary drive mounted at a distal end of the pendulum arm so that the second bidirectional rotary drive moves with the distal end;
   a substrate holder configured to support a substrate disposed in the vacuum chamber and coupled to the second bidirectional rotary drive at a pivot point that is offset from the center of the substrate by an offset distance that is less than the outer radius of the substrate, the second bidirectional rotary drive being configured to rotate the substrate holder about the pivot point alternating between a clockwise direction and a counterclockwise direction synchronously with arc motion of the pendulum arm; and
   a controller coupled to the first bidirectional rotary drive and the second bidirectional rotary drive, the controller being configured to synchronously drive the first bidirectional rotary drive and the second bidirectional rotary drive to cause a parallel raster pattern to be traced on the substrate by a stationary location-specific processing apparatus.

2. The system of claim 1, wherein the first bidirectional rotary drive is disposed outside the vacuum chamber and coupled to the proximal end of the pendulum arm via a rotary feedthrough shaft.

3. The system of claim 1, wherein the location-specific processing apparatus comprises two or more static processing nozzles located at different distances from the proximal end of the pendulum arm.

4. The system of claim 1, wherein the location-specific processing apparatus comprises a single processing nozzle translatable between two or more different distances from the proximal end of the pendulum arm.

5. The system of claim 1, further comprising:
   a lift mechanism disposed on the substrate holder and configured to lift the substrate off of the substrate holder and rotate the substrate 180 degrees to a new position relative to the substrate holder.

6. The system of claim 1, further comprising:
   an actuator coupled to the pivot point, the actuator configured to shift the pivot point by translating the substrate relative to the pivot point.

7. The system of claim 6, wherein the actuator is further configured to shift the pivot point by translating the substrate after the parallel raster pattern has been traced by the location-specific processing apparatus over a partial area of the substrate.

8. The system of claim 1, wherein a major dimension of the vacuum chamber measured in the plane of the substrate holder is substantially equal to the sum of the length of the pendulum arm, the offset distance, and the outer radius of the substrate.

9. The system of claim 1, wherein the location-specific processing apparatus is a particle beam source configured to focus a localized spot on the substrate.

10. An apparatus comprising:
    a processing chamber;
    a pendulum arm disposed in the processing chamber and comprising a proximal end and a distal end, the proximal end being coupled to a first rotary drive configured to move the pendulum arm in an arc motion centered at the proximal end;
    a substrate holder disposed in the processing chamber and coupled to a second rotary drive at a pivot point that is offset from the center of the substrate holder in a first direction by an offset distance that is less than the outer radius of the substrate holder, the second rotary drive being mounted at the distal end of the pendulum arm and being configured to rotate the substrate holder about the pivot point synchronously with the arc motion of the pendulum arm to move the substrate holder laterally relative to a location-specific processing apparatus; and
    an actuator coupled to the pivot point, the actuator configured to shift the pivot point by translating a substrate relative to the pivot point.

11. The apparatus of claim 10, wherein a major dimension of the processing chamber measured in the plane of the substrate holder is substantially equal to the sum of the length of the pendulum arm, the offset distance, and the outer radius of the substrate holder.

12. The apparatus of claim 10, wherein the actuator is further configured to shift the pivot point by translating the substrate after a parallel raster pattern has been traced by the location-specific processing apparatus over a partial area of the substrate.

13. An apparatus comprising:
a processing chamber;
a pendulum arm disposed in the processing chamber and comprising a proximal end and a distal end, the proximal end being coupled to a first bidirectional rotary drive configured to move the pendulum arm in an arc motion centered at the proximal end;
a substrate holder disposed in the processing chamber and coupled to a second bidirectional rotary drive at a pivot point, the second bidirectional rotary drive being mounted at the distal end of the pendulum arm and being configured to rotate the substrate holder about the pivot point alternating between a clockwise direction and a counterclockwise direction synchronously with the arc motion of the pendulum arm to trace a parallel raster pattern on the substrate holder using a stationary location-specific processing apparatus; and
a lift mechanism disposed on the substrate holder and configured to lift a substrate off of the substrate holder and rotate the substrate 180 degrees to a new position relative to the substrate holder.

14. The apparatus of claim 13, wherein the first bidirectional rotary drive is disposed outside the processing chamber and coupled to the proximal end of the pendulum arm via a rotary feedthrough shaft.

15. The apparatus of claim 13, wherein the pivot point is at the center of the substrate holder.

16. The apparatus of claim 15, wherein the location-specific processing apparatus comprises two or more static processing nozzles located at different distances from the proximal end of the pendulum arm.

17. The apparatus of claim 15, wherein the location-specific processing apparatus comprises a single processing nozzle translatable between two or more different distances from the proximal end of the pendulum arm.

18. The apparatus of claim 10, wherein the location-specific processing apparatus is a particle beam source configured to focus a localized spot on the substrate.

19. The apparatus of claim 13,
wherein the substrate holder is configured to support a substrate,
wherein the pivot point is offset from the center of the substrate by an offset distance that is less than the outer radius of the substrate, and
wherein a major dimension of the processing chamber measured in the plane of the substrate holder is substantially equal to the sum of the length of the pendulum arm, the offset distance, and the outer radius of the substrate.

20. The apparatus of claim 13, wherein the location-specific processing apparatus is a particle beam source configured to focus a localized spot on the substrate.

* * * * *